United States Patent
Rimondi et al.

(10) Patent No.: US 9,245,606 B2
(45) Date of Patent: Jan. 26, 2016

(54) SRAM MEMORY DEVICE AND TESTING METHOD THEREOF

(71) Applicants: STMicroelectronics PVT LTD., Uttar Pradesh (IN); STMicroelectronics S.r.l., Agrate Brianza (IT)

(72) Inventors: Danilo Rimondi, Mozzo (IT); Carolina Selva, Cologno Monzese (IT); Ashish Kumar, Ranchi (IN)

(73) Assignees: STMICROELECTRONICS INTERNATIONAL N.V., Amsterdam (NL); STMICROELECTRONICS S.R.L., Agrate Brianza (IT)

( * ) Notice: Subject to any disclaimer, the term of this patent is extended or adjusted under 35 U.S.C. 154(b) by 49 days.

(21) Appl. No.: 13/682,592

(22) Filed: Nov. 20, 2012

(65) Prior Publication Data

US 2013/0128656 A1    May 23, 2013

(30) Foreign Application Priority Data

Nov. 23, 2011 (IT) .......................... TO2011A001080

(51) Int. Cl.
| | |
|---|---|
| *G11C 11/00* | (2006.01) |
| *G11C 11/14* | (2006.01) |
| *G11C 11/413* | (2006.01) |
| *G11C 7/20* | (2006.01) |
| *G11C 7/22* | (2006.01) |
| *G11C 29/12* | (2006.01) |
| *G11C 29/24* | (2006.01) |
| *G11C 11/41* | (2006.01) |

(52) U.S. Cl.
CPC *G11C 11/00* (2013.01); *G11C 7/20* (2013.01); *G11C 7/227* (2013.01); *G11C 11/413* (2013.01); *G11C 29/12015* (2013.01); *G11C 29/24* (2013.01); *G11C 11/41* (2013.01)

(58) Field of Classification Search
CPC .............. G11C 11/00; G11C 13/0004; G11C 13/0069; G11C 13/0007; G11C 13/0021; G11C 13/0064; G11C 16/10; G11C 16/3436
USPC .......................................... 365/154, 201, 200
See application file for complete search history.

(56) References Cited

U.S. PATENT DOCUMENTS

2005/0201167 A1    9/2005    Lee et al.
2008/0298143 A1*  12/2008    Chen et al. .................... 365/194

FOREIGN PATENT DOCUMENTS

EP    1 643 507 A2    4/2006

OTHER PUBLICATIONS

Extended Italian Search Report, dated Sep. 7, 2012, for Italian Application No. TO20111080, 7 pages.

*Primary Examiner* — Hien Nguyen
(74) *Attorney, Agent, or Firm* — Seed IP Law Group PLLC

(57) ABSTRACT

A static random access memory (SRAM) device includes a memory array of a plurality of memory cells, a controller that receives an external clock signal formed by a succession of external pulses and generates an internal clock signal formed by a succession of internal pulses, and a driving circuit that receives the internal clock signal. The controller is operable in a first mode, wherein the controller generates, for each external pulse, a corresponding internal pulse and the controller controls the driving circuit so that the driving circuitry carries out one access to the memory array for each internal pulse. The controller is further operable in a second mode, wherein the controller generates, for each external pulse, a pair of internal pulses, and the controller controls the driving circuitry so that, for each pair of internal pulses, the driving circuitry writes a first data item in a set of memory cells, and then reads the set of memory cells, so as to acquire a second data item.

15 Claims, 4 Drawing Sheets

SRAM MEMORY DEVICE AND TESTING METHOD THEREOF

BACKGROUND

1. Technical Field

The present disclosure relates to an improved static random-access memory (SRAM) memory device and to a method for testing the same.

2. Description of the Related Art

As shown in FIG. 1, an SRAM memory device 1 of the known type is formed by a memory array 2 including a plurality of SRAM cells 3, these latter being arranged so as to define a first number N of rows and a second number M of columns.

In addition, the SRAM memory device 1 comprises a row decoder 4, a first pre-charge circuit 6 and a read/write circuit 8. Furthermore, the SRAM memory device 1 comprises a number of first conductive paths WL equal to the number N of rows, these first conductive paths WL being known as word lines and being connected to the row decoder 4; each word line WL is further connected to the SRAM cells 3 of the corresponding row of the memory array 2.

The SRAM memory device 1 includes also, for each column of SRAM cells 3, a first and a second bit-line BLC, BLT. In particular, given a column of SRAM cells 3, the corresponding first and second bit-line BLC, BLT are both connected to the first pre-charge circuit 6 and to the read/write circuit 8 (these latter connections not being shown), as well as to the SRAM cells 3 of the corresponding column of the memory array 2. Although not shown in FIG. 1, the SRAM memory device may also include a multiplexing circuit, which allows the device to write several words in each row; however, for the sake of simplicity, in the following it will be assumed that such a multiplexing circuit is absent.

In greater detail, as shown in FIG. 2, each SRAM cell 3 is formed by a first and a second transistor PUF, PUT, generally of the P-MOS type and referred to as the first and the second load transistor, and a third and a fourth transistor PDF and PDT, generally of the N-MOS type and referred to as the first and the second pull-down transistor. Furthermore, each SRAM cell 3 comprises a fifth and a sixth transistor PGF and PGT, generally of the N-MOS type and referred to as the first and the second selecting transistor.

The control terminal of the first load transistor PUF is connected to the control terminal of the first pull-down transistor PDF, thereby defining a first node T. A first conductive terminal of the first load transistor PUF is connected to a first conductive terminal of the first pull-down transistor PDF, thereby defining a second node F. A second conductive terminal of the first load transistor PUF is connected to a third node DD, which, in use, is set to a supply voltage $V_{DD}$; a second conductive terminal of the first pull-down transistor PDF is connected to ground.

The control terminal of the second load transistor PUT and the control terminal of the second pull-down transistor PDT are both connected to the second node F. A first conductive terminal of the second load transistor PUT and a first conductive terminal of the second pull-down transistor PDT are both connected to the first node T. Furthermore, a second conductive terminal of the second load transistor PUT is connected to the third node DD, whereas a second conductive terminal of the second pull-down transistor PDT is connected to ground.

In addition, the control terminals of the first and the second selecting transistor PGF, PGT are both connected to the word line WL which corresponds to the considered SRAM cell 3. The first and the second conductive terminal of the first selecting transistor PGF are respectively connected to the second node F and the first bit line BLC of the considered SRAM cell 3; the first and the second conductive terminals of the second selecting transistor PGT are respectively connected to the first node T and the second bit line BLT of the considered SRAM cell 3.

As is known, each SRAM cell 3 stores a logic value (bit), which is equal to "1" or "0". Each stored logic value corresponds to a pair of voltages of the first and the second node T, F. As an example, when the SRAM cell 3 stores the logic value "1", the voltage on the first node T is high, whereas the voltage on the second node F is low; conversely, when the SRAM cell 3 stores the logic value "0", the voltage on the first node T is low, whereas the voltage on the second node F is high. Of course, the relationships between the stored logic values and the voltages on the first and second node T, F may be reversed. However, for the sake of simplicity, in the following it is assumed that the logic value "1" corresponds to a high voltage on the first node T and a low voltage on the second node F.

Operatively, the row decoder 4 may be controlled so as to dynamically select one from among the N word lines WL, namely to set a high voltage on the selected word line WL, and to set a low voltage on all the other word lines WL. To this end, the row decoder 4 receives an address signal ADDR, which represents the word line WL to be selected. In such a way, all the SRAM cells 3 of the row which corresponds to the address signal ADDR are selected, namely the corresponding first and second node T, F are connected to the corresponding second and first bit lines BLT, BLC, thereby allowing the device to read or write the selected SRAM cells 3, as described hereinbelow.

That being said, and referring again to FIG. 1, the SRAM memory device 1 further includes a dummy read cell 20, a dummy row 22, a dummy row decoder 24, a dummy read column 26, a second pre-charge circuit 28 and a dummy amplifier 30. Furthermore, the SRAM memory device 1 includes a controller circuit 40.

In detail, the dummy row 22 comprises a number M of SRAM memory cells 3 (not shown), which are connected to the dummy row decoder 24 by means of a dummy word line DWL; furthermore, each SRAM cell 3 of the dummy row 22 is connected to the corresponding pair of first and second bit line BLC, BLT. In addition, the dummy read cell 20 is formed by a "hard-wired" SRAM cell, namely by an SRAM cell whose first and second node T, F are set to fixed voltages. Put in other words, the dummy read cell 20 stores a fixed logic value; furthermore, the dummy read cell 20 is connected to the dummy word line DWL.

The dummy read column 26 comprises a number N of further SRAM cells (not shown); these further SRAM cells are not active, namely the control terminals of the first and second selecting transistor PGF, PGT of each of these further SRAM cells are connected to ground, so that these further SRAM cells act as a capacitive load. Therefore, the SRAM cells of the dummy read column 26 cannot be accessed.

In greater detail, all the SRAM cells of the dummy read column 26 and the dummy read cell 20 are connected to the same pair of first and second bit line, hereinafter referred to as the first and the second dummy bit line DBLC, DBLT, these first and second dummy bit line DBLC, DBLT being further connected to the second pre-charge circuit 28, as well as to the dummy amplifier 30 (this connection not being shown in FIG. 1). The SRAM cells of the dummy read column 26 define a capacitive load of the first and second dummy bit line DBLC, DBLT.

From a practical point of view, the memory array 2, the dummy row 22, the dummy read cell 20 and the dummy read column 26 form a sort of expanded memory array, which is formed by (N+1)*(M+1) SRAM cells.

Operatively, the controller circuit 40 is adapted to receive, besides the address signal ADDR, an external clock signal clk and a write enable signal WEN. The external clock signal clk represents a clock, namely a periodic squared pulse train.

In detail, based upon the external clock signal clk, the controller circuit 40 may access the memory array 2, either to write or read a selected row of the memory array 2. In greater detail, at each clock pulse of the external clock signal clk, the controller circuit 40 either writes or reads a row of the memory array 2, according to the logic value of the write enable signal WEN; in particular the writing or reading is performed at an address (namely, a row of the memory array 2) indicated by the address signal ADDR.

In particular, in order to avail of a timing signal for carrying out the reading or the writing, the controller circuit 40 generates an internal clock signal clk-int, based upon the external clock signal clk, this internal clock signal clk-int being inputted to both the row decoder 4 and the read/write circuit 8, as well as to the dummy row decoder 24. In addition, based upon the external clock signal clk, the controller circuit 40 generates a pre-charge signal pch, which is inputted to both the first and the second pre-charge circuit 6, 28. In particular, the pre-charge signal pch is active when low, namely the first and second pre-charge circuit 6, 28 are activated when the pre-charge signal pch is low. Therefore, referring as an example to the second pre-charge circuit 26, when the pre-charge signal pch is low, both the first and the second dummy bit line DBLC, DBLT are driven by the second pre-charge circuit 26 to a voltage equal to the supply voltage $V_{DD}$.

In greater detail, as shown in FIG. 3, each rising edge of the internal clock signal clk-int is triggered by a corresponding rising edge of the external clock signal clk, from which it is delayed by a certain amount of time, which depends on the controller circuit 40. The same applies for the rising edges of the pre-charge signal pch, whose rising edges are triggered by the rising edges of the external clock signal clk.

Furthermore, after each rising edge of the internal clock signal clk-int, both the dummy word line DWL and the word line WL corresponding to the row indicated by the address signal ADDR (hereinafter referred to as array word line WLi) are asserted, namely are set at a high voltage, respectively by the dummy row decoder 24 and the row decoder 4. In addition, the corresponding rising edge of the pre-charge signal pch causes the first and the second pre-charge circuit 6, 28 to stop the pre-charge on all of the first and second bit lines BLC, BLT, as well as on the first and second dummy bit line DBLC, DBLT.

From a practical point of view, each rising edge of the internal clock clk-int causes an inhibition of the pre-charge, as well as the assertion of the dummy word line DWL and of one among the word lines WL, in particular the array word line WLi. Put in other words, if reference is made to the signals sDWL and sWLi to indicate the electric signals on the dummy word line DWL and the array word line WLi, each rising edge of the internal clock signal clk-int causes a corresponding rising edge of each of the signals sDWL and sWLi.

Afterwards, according to the write enable signal WEN, a reading or writing is performed. In both cases, a discharge occurs on one of the first and second dummy bit lines DBLC, DBLT, depending on the fixed voltages of the first and second node T, F of the dummy read cell 20. This discharge is detected and performed by the dummy amplifier 30, which acts as a dummy write discharge circuit, and which generates a timing signal RESET. In particular, upon detecting such a discharge, the dummy amplifier 30 generates a falling edge of the timing signal RESET, delayed with respect to the rising edge of the internal clock signal clk-int. The timing signal RESET is inputted to the read/write circuit 8.

Furthermore, based on the write enable signal WEN, during the time interval between the rising edge of the pre-charge signal pch and the falling edge of the timing signal RESET, the read/write circuit 8 performs one of the following two sets of operations.

In detail, in case the write enable signal WEN indicates writing, the read/write circuit 8 writes the SRAM cells 3 of the array word line WLi. To this end, as soon as the pre-charge signal pch goes high, each of the first and second bit line BLC, BLT of each of the SRAM cells of the array word line WLi is driven by the read/write circuit 8 to a corresponding voltage; to this end, the read/write circuit 8 comprises a plurality of writing driving circuits (not shown). In such a way, when the array word line WLi is asserted, given an SRAM cell of the array word line WLi, the voltages on the corresponding first an second node T, F are forced by the voltages on the corresponding second and first bit line BLT, BLC, thereby causing the given SRAM cell to store a given logic value.

On the other hand, if the write enable signal WEN indicates reading, the read/write circuit 8 reads the SRAM cells 3 of the array word line WLi. In detail, the end of the pre-charge and the assertion of the array word line WLi causes, a considered SRAM cell among the SRAM cells connected to the array word line WLi, the discharge of one of the corresponding first and second bit line BLC, BLT, depending on the logic value stored within the considered SRAM cell. From a practical point of view, this discharge causes a voltage difference between the first and second bit line BLC, BLT connected to the considered SRAM cell; such a voltage difference is detected by the read/write circuit 8 (to this end, the read/write circuit 8 comprises a plurality of reading driving circuits), thereby allowing the device to detect the logic value stored in the considered SRAM cell. In particular, the reading driving circuits are controlled by the timing signal RESET and each of them detects the respective voltage difference at the falling edge of the timing signal RESET.

In greater detail, the timing signal RESET is inputted also to the controller circuit 40, which generates a corresponding falling edge of the internal clock signal clk-int, as well as a corresponding falling edge of the pre-charge signal pch. In addition, both the dummy word line DWL and the array word line WLi are driven to a low voltage, so as to be ready to receive a new address signal ADDR and perform a new reading or writing at the next rising edge of the external clock signal clk.

When the pre-charge signal pch goes down, the first and the second pre-charge circuit 6, 28 start again to pre-charge the bit lines to which they are connected. In particular, the new pre-charge of the first and second dummy bit line DBLC, DBLT is detected by the dummy amplifier 30, which generates a rising edge of the timing signal RESET.

From a practical point of view, the dummy row 22, the dummy read cell 20 and the dummy column 26 represent a dummy path, also known as self-timing path, which can be used to determine the time performances of the SRAM memory device 1, and in particular to determine the discharge time of the first and second bit lines BLC, BLT. To this regard, it has to be noted that the dummy path is designed so that, when the first (or second, as the case may be) dummy bit line DBLC is discharged, it may be safely assumed that also the bit lines of the memory array 2 which have to be discharged (depending on the stored logic values) have already been discharged. Therefore, the falling edge of the timing signal RESET defines a time instant at which the reading or writing has indeed been accomplished.

Put in other words, the discharge time of the dummy read cell 20 (i.e., of one of the first and second dummy bit lines DBLC, DBLT) defines an internal limit to the speed of the SRAM memory device 1.

That being said, known SRAM cells are affected by the so-called write time problem. In general, the write time is the time taken by the SRAM cell to flip the voltages of its first and second node F, T following a voltage change on the first and second bit line BLC, BLT; such a voltage change being forced during a writing operation.

In detail, consider the second node F, and assume that the voltage $V_F$ on the second node F is low. In such a case, the first load transistor PUF is "weak", namely is resistive, and a relatively long time is required to pull up the voltage $V_F$ to a high level, such as during a writing operation aiming at setting the voltages $V_F$ and $V_T$ to, respectively, a high and a low voltage. Similar problems arise on the first node T. In this case, the second load transistor PUT is weak, thereby leading to long writing times, namely to writing times longer than the designed writing times.

Long write times may cause problems, in particular at high frequencies, namely at frequencies such that the time window available for carrying out a writing/reading is so small that even a small weakness of the SRAM cells can cause errors.

In detail, long write times may lead to two different kinds of failures. In greater detail, a so-called read failure may occur, in case the voltage difference between the first and second node T, F is such that the read/write circuit 8, during a reading which follows the abovementioned writing operation, does not detect the correct logic value. In fact, as already said, the voltage $V_F$ is less than designed for such a situation, and, since the second node F controls the second pull-down transistor PDT, the voltage $V_T$ is higher than designed, thereby leading to an incorrect detection by the read/write circuit 8, and in particular by the reading driving circuits contained therein.

Furthermore, long write times may lead to the so-called static noise margin (SNM) failure. With reference to the above example, it may happen that an insufficient voltage $V_F$ causes a SNM failure during the reading operation. In fact, a relatively low voltage $V_F$ causes a low conductivity of the second pull-down transistor PDT, thereby leading to a voltage increase on the first node T. Such a voltage increase on the first node T may cause a flip of the logic value stored by the SRAM cell, namely an undesired switching of the SRAM cell.

Unfortunately, failures due to the write time problem cannot be easily detected by means of traditional testing methods. In fact, high speed access is used to detect write time induced failures, therefore a dedicated test chip is used; such a test chip being provided with an embedded built-in self test (BIST) circuit; such a BIST circuit is in turn optimized to perform high speed accesses. This kind of test chip is expensive and limited to specific sizes of the SRAM memory device to be tested.

BRIEF SUMMARY

Therefore, the disclosure provides for an SRAM memory device solving at least in part the problems encountered by the prior art. According to the disclosure, there are provided an SRAM memory device and a testing method according to, respectively, claim 1 and claim 8.

BRIEF DESCRIPTION OF THE SEVERAL VIEWS OF THE DRAWINGS

For the understanding of the present disclosure, embodiments are now described, purely as non-limitative examples, with reference to the enclosed drawings, wherein.

DETAILED DESCRIPTION

Figure 1:
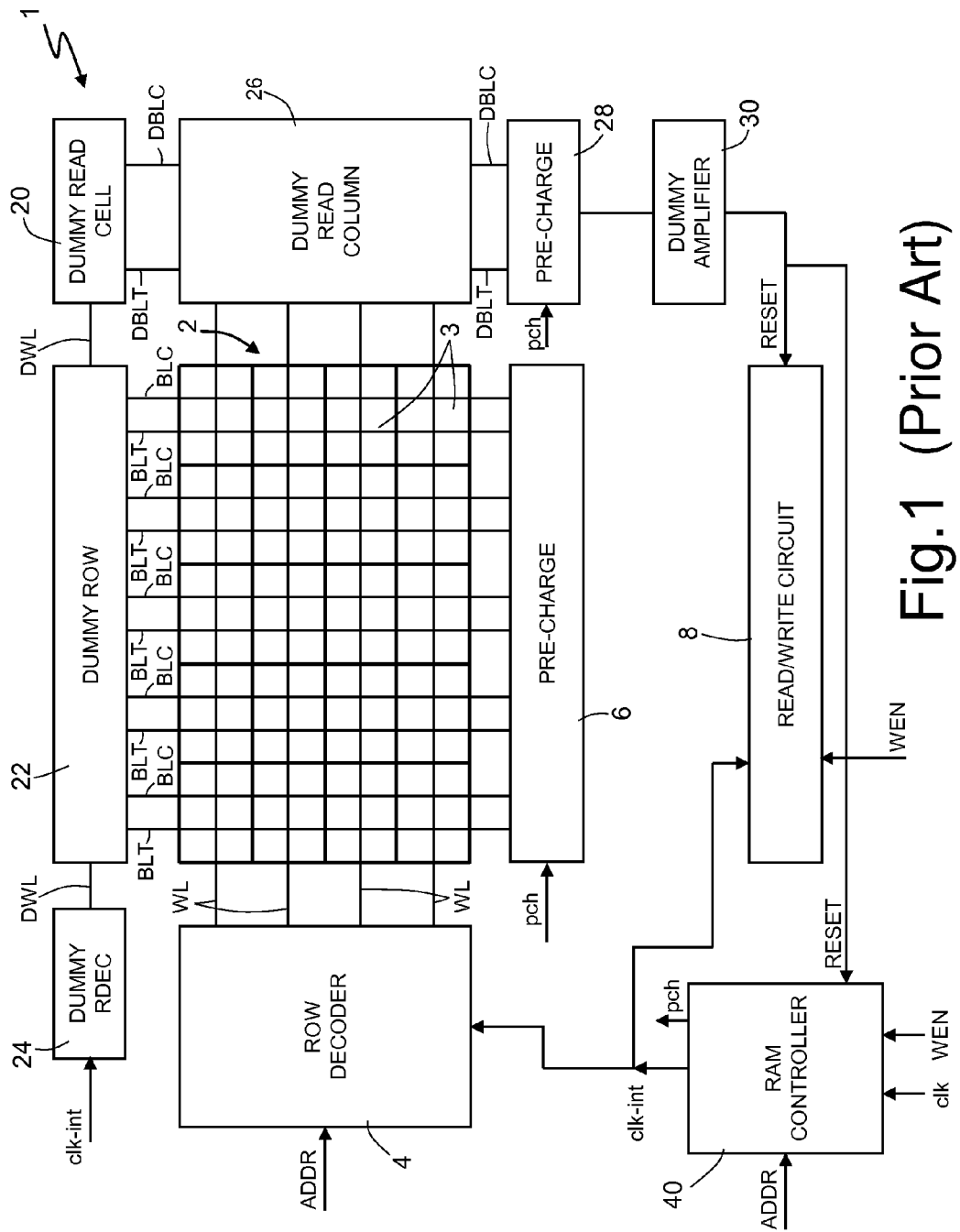
FIG. 1 shows block diagram of an SRAM memory device of the known type.
Figure 2:
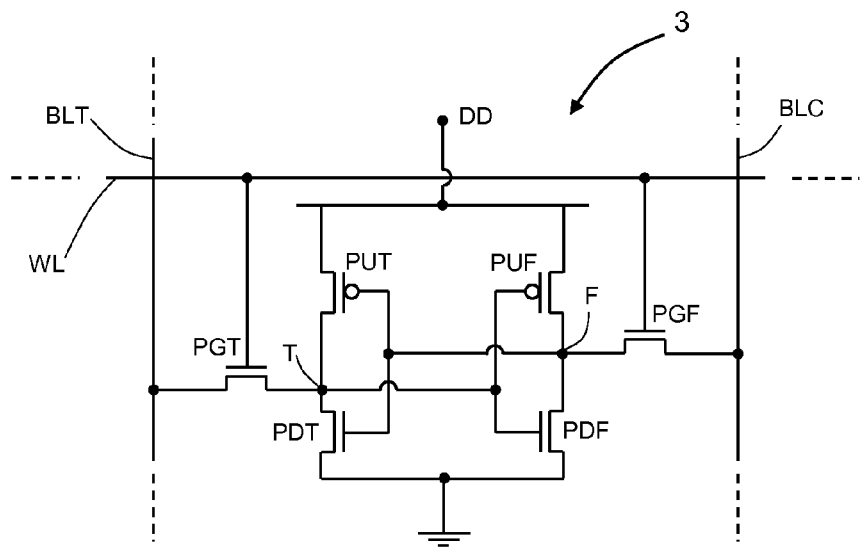
FIG. 2 shows a circuit scheme of a portion of an SRAM cell of the known type.
Figure 3:
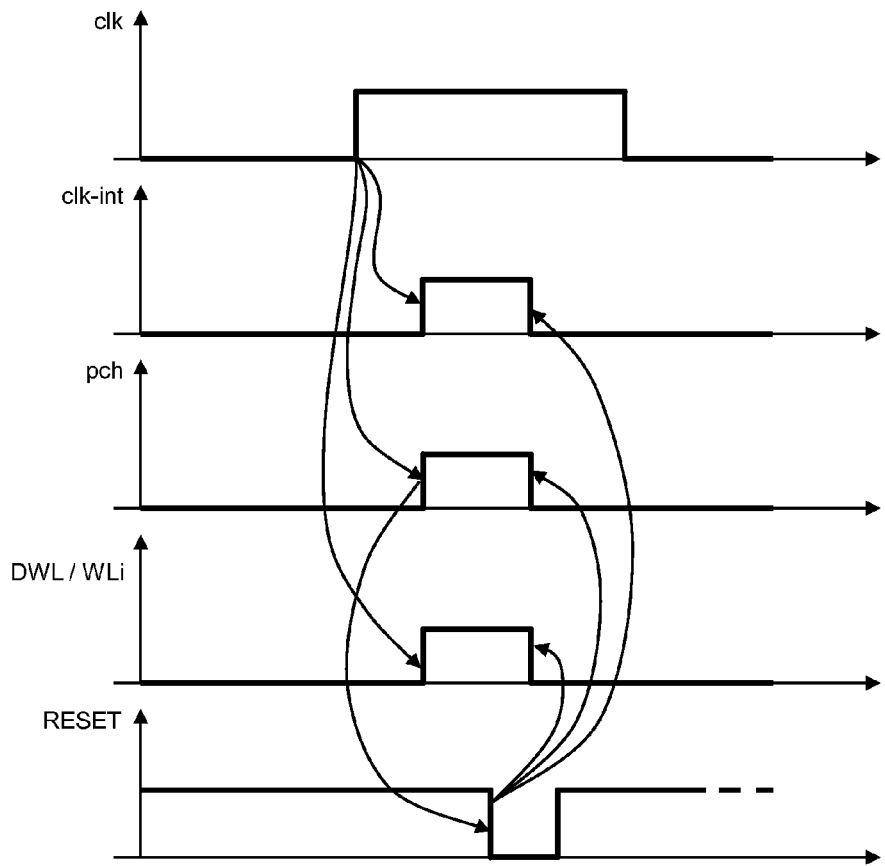
FIG. 3 shows time plots of electric signals generated within the SRAM memory device shown in FIG. 1.
Figure 4:
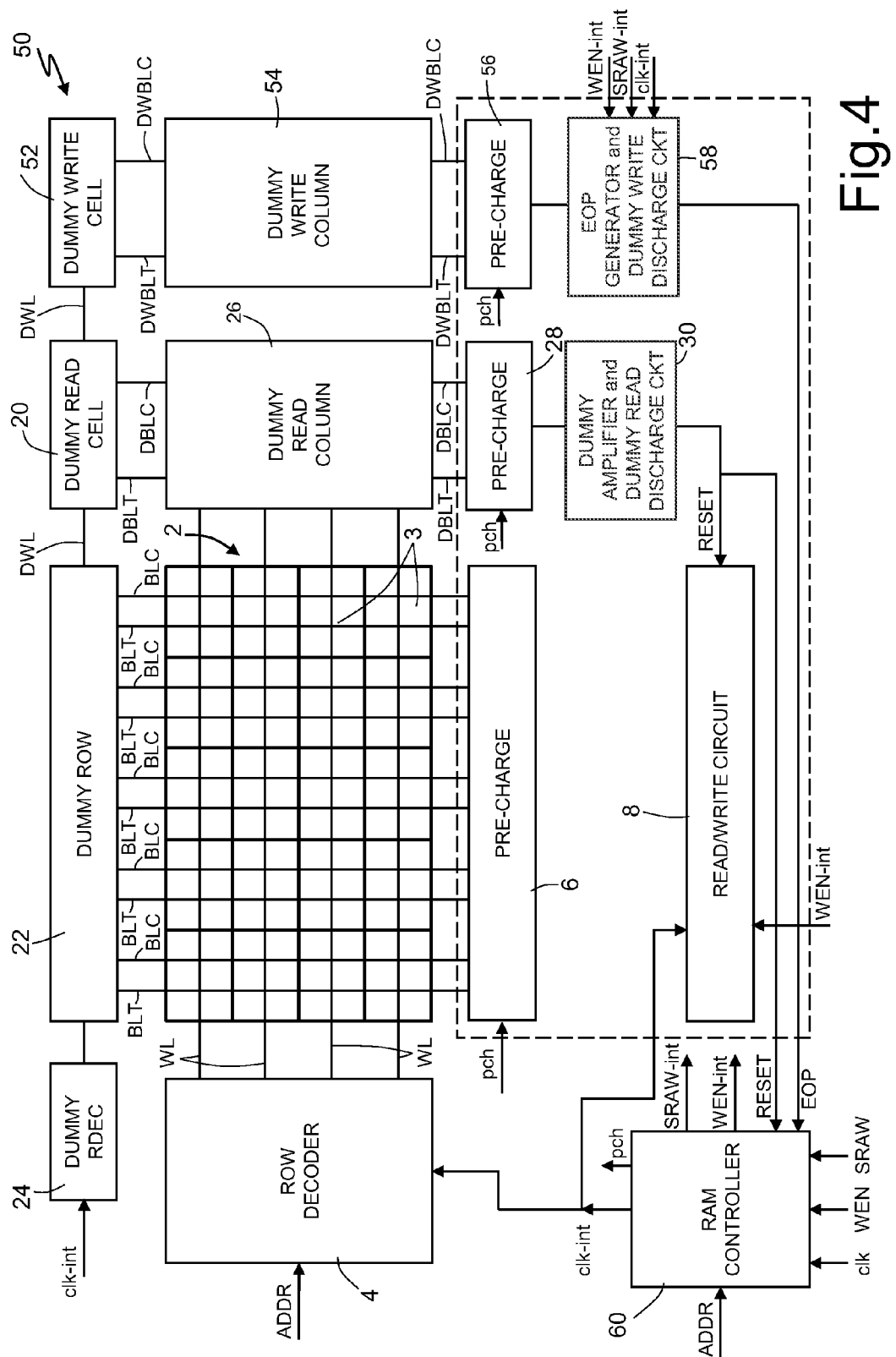
FIG. 4 shows an SRAM memory device according to the present disclosure.

The present disclosure describes embodiments with reference to the SRAM memory device 50 shown in FIG. 4, wherein components already present in the SRAM memory device 1 shown in FIG. 1 are indicated by the same reference signs.

In detail, the SRAM memory device 50 comprises a dummy write cell 52, a dummy write column 54, a third pre-charge circuit 56 and an end-of-pre-charge ("EOP") generator 58.

In greater detail, the dummy write cell 52 is formed by a respective SRAM cell, which is connected to the dummy write line DWL. Furthermore, the SRAM cell which forms the dummy write cell 52 may be inactive, namely the control terminals of its first and the second selecting transistor PGF, PGT may be connected to ground; in such a way, the power consumption is reduced.

The dummy write column 54 is formed by a number N of SRAM cells, which are not active. Therefore, the control terminals of the first and second selecting transistor PGF, PGT of each of the SRAM cells of the dummy write column 54 are connected to ground.

In greater detail, all the SRAM cells of the dummy write column 54 and the dummy write cell 52 are connected to the same pair of first and second bit lines, hereinafter referred to as the first and the second dummy write bit lines DWBLC, DWBLT, these first and second dummy write bit lines DWBLC, DWBLT being further connected to the third pre-charge circuit 56, as well as to the EOP generator 58 (this latter connection not being shown in FIG. 4). Therefore, the SRAM cells of the dummy write column 54 define a capacitive load of the first and second dummy write bit lines DWBLC, DWBLT.

The third pre-charge circuit 56 receives at input the pre-charge signal pch generated by the controller circuit, this latter being herein designated by 60.

The EOP generator 58 is connected to the first and second dummy write bit lines DWBLC, DWBLT; furthermore its output is connected to the controller circuit 60.

In greater detail, the controller circuit 60 is adapted to receive a mode signal SRAW, which defines a particular operating mode. As an example, the mode signal SRAW may be generated by an external microcontroller (not shown).

In particular, when the mode signal SRAW is high, the functioning of the SRAM memory device 50 deviates from the functioning of the SRAM memory device 1 shown in FIG. 1, as described hereinafter with reference to FIG. 5, wherein electric signals generated within the SRAM memory device 50 during three pulses of the external clock signal clk are shown.

Irrespective of the logic value of the mode signal SRAW, the controller circuit 60 generates a latched write enable signal WEN-int and a latched mode signal SRAW-int, respectively based on the write enable signal WEN and the mode signal SRAW. In particular, the latched write enable signal WEN-int and the latched mode signal SRAW-int are obtained by latching respectively the write enable signal WEN and the mode signal SRAW with the internal clock signal clk-int. Both the latched write enable signal WEN-int and the latched mode signal SRAW-int are inputted to the EOP generator 58, together with the internal clock signal clk-int. Furthermore, the latched write enable signal WEN-int is inputted to the read/write circuit 8, instead of the write enable signal WEN.

In greater detail, when the mode signal SRAW is low, the SRAM memory device 50 operates like the SRAM memory device 1 shown in FIG. 1.

When the mode signal SRAW is high, following a rising edge of the internal clock signal clock-int, corresponding rising edges of the pre-charge signal pch and of the signals sDWL and sWLi are generated, as when the mode signal SRAW is low. Furthermore, the dummy amplifier 30 generates the timing signal RESET as explained above, thereby causing the controller circuit 60 to generate corresponding falling edges of the internal clock signal clk-int and of the pre-charge signal pch. In addition, both the dummy word line DWL and the array word line WLi are driven to a high voltage, namely corresponding rising edges are generated within the signals sDWL and sWLi.

Besides that, one of the first and second dummy write bit lines DWBLC, DWBLT is discharged by the EOP generator 58, following the reception of the rising edge of the pre-charge signal pch. Hereinafter, the bit-line discharged by the EOP generator 58 will be referred to as the trigger bit line; the electric signal on the trigger bit line is referred to as the trigger signal sDWBL. In this way, the EOP generator 58 acts as a dummy write discharge circuit.

The trigger signal sDWBL is provided at input of the EOP generator 58, which in turn generates an EOP signal, which is inputted to the controller circuit 60.

In greater detail, the rising edge of the pre-charge signal pch causes a corresponding falling edge of the trigger signal sDWBL, due to the discharge of the trigger bit line. Furthermore, the falling edge of the pre-charge signal pch causes a corresponding rising edge of the trigger signal sDWBL; in particular, both the falling edge and the rising edge of the trigger signal sDWBL have profiles which can be described by means of exponential curves with not infinite time constants.

More in particular, referring to a generic column of the memory array 2 as the actual column, the actual column and the dummy write column 54 are pre-charged and discharged following the same timing, as described above. Furthermore, the actual column and the dummy write column 54 define an actual load and a dummy load, respectively on the actual bit line (the bit line, between the first and second bit line which are connected to the actual column, which is about to be discharged during a reading/writing) and on the trigger bit line. The actual load and the dummy load are both resistive-capacitive ("RC"); furthermore, the EOP generator 58 and the actual load and the dummy load are such that the rising edge of the EOP signal, which is set low by the EOP generator 58 following the detection of the rising edge of the internal clock signal clk-int, is generated when the actual bit line reaches, after being discharged, a voltage equal to the supply voltage $V_{DD}$. As an example, the EOP generator 58 may include an inverter (not shown), the trip point of the inverter and the actual load and the dummy load being such that the inverter switches (and hence generates the rising edge of the EOP signal) when the actual bit line reaches a voltage equal to the supply voltage $V_{DD}$, namely when the new pre-charge of the actual bit line is completed.

In greater detail, the controller circuit 60 drives the latched write enable signal WEN-int at a low voltage, after the rising edge of the internal clock signal clk-int. Therefore, during the time interval between the rising edge of the pre-charge signal pch and the falling edge of the timing signal RESET, the read/write circuit 8 writes a first data item in the SRAM cells 3 of the array word line WLi.

Furthermore, the controller circuit 60 generates a rising edge of the latched write enable signal WEN-int, after the falling edge of the internal clock signal clk-int, this latter, as already said, being triggered by the falling edge of the timing signal RESET.

That being said, when the controller circuit 60 detects the rising edge of the EOP signal, and hence the end of the writing, it performs a reading, on the SRAM cells 3 of the array word line WLi.

In detail, after detecting a rising edge of the EOP signal, the controller circuit 60 generates a new rising edge of the internal clock signal clk-int. Furthermore, as already described, the new rising edge of the internal clock signal clk-int causes the generation, still by the controller circuit 60, of a new rising edge of the pre-charge signal pch, a new rising edge of the signals sDWL and sWLi, as well as of a new falling edge of the timing signal RESET, which is delayed by a certain amount of time with respect to the new rising edge of the internal clock signal clk-int. As an exception, the new rising edge of the internal clock signal clk-int is not used by the controller circuit 60 to latch any one of the latched write enable signal WEN-int and the latched mode signal SRAW-int.

Furthermore, since the latched write enable signal WEN-int has already been asserted (after receiving the falling edge of the internal clock signal clk-int, which precedes the new rising edge), during the time interval between the new rising edge of the pre-charge signal pch and the new falling edge of the timing signal RESET, the read/write circuit 8 reads a second data item in the SRAM cells 3 of the array word line WLi. In the case of an absence of errors, the second data item is the same as the first data item.

The new falling edge of the timing signal RESET causes corresponding new falling edges of the internal clock signal clk-int, of the pre-charge signal pch and of the signals sDWL, sWLi. Furthermore, after these new falling edges of the internal clock signal clk-int, of the pre-charge signal pch and of the signals sDWL, sWLi, the falling edge of the mode signal SRAW brings the SRAM memory device 50 back to a per se known initial state, which namely makes the SRAM memory device 50 ready to acquire a new address and carry out a reading or writing in a per se known manner.

From a practical point of view, when the mode signal SRAW is asserted, the trigger signal sDWBL tracks the pre-charge of the bit-lines of the memory array 2 during a writing, so as to detect the end of the recharge after the writing and generate the EOP signal. After the end of such a writing, the SRAM memory device 1 is set to a reading mode by means of the latched write enable signal WEN-int, and a reading is indeed performed. In particular, the timing of such a reading is given by a new pulse of the internal clock signal clk-int, triggered by the EOP signal. Such a reading is hence performed before receiving a new pulse of the external clock signal clk, hence defines a sort of high access to the memory array 2. In addition, this high speed access is made at the same address used during the preceding writing. Therefore, by comparing the abovementioned first and second data item, it is possible to detect errors that occurred during this preceding writing. It is thus possible to detect faulty SRAM cells, as an example by iterating the SRAM mode operations for all the SRAM cells 3 of the memory array 3, thereby obtaining a matrix of the faulty SRAM cells. The above mentioned comparison may be carried out by the controller circuit 60.

Put in other words, when the mode signal SRAW is low, the controller circuit 60 generates, for each pulse of the external clock signal clk, a corresponding pulse of the internal clock signal clk-int, and controls the read/write circuit 8 so that this latter carries out one access to the memory array for each pulse of the internal clock signal clk-int. In addition, when the mode signal SRAW is high, the controller circuit 60 generates, for each pulse of the external clock signal clk, a corresponding pair of pulses of the internal clock signal clk-int, and controls the read/write circuit 8 so that: upon receiving the first pulse of the pair of pulses of the internal clock signal clk-int, the read/write circuit 8 writes the first data item in a first set of memory cells; and, upon receiving the second pulse of the pair of pulses of the internal clock signal clk-int, the read/write circuit 8 reads this set of memory cells, so as to acquire the second data item.

That being said, once an SRAM cell is detected as faulty, it is further possible to determine whether the SRAM cell is affected by a read failure or a static noise margin (SNM) failure. As shown in FIG. 5, to distinguish between these two kind of failures, it possible to perform an additional reading of the faulty SRAM cell.

In detail, assuming that the faulty SRAM cell belongs to the SRAM cells of the above mentioned array word line WLi, the additional reading is performed in a per se known manner, so as to read a third data item, which is contained in the SRAM cells of the array word line WLi. Prior to performing the additional reading, the mode signal SRAW is set low, and the write enable signal WEN is brought high.

The additional reading is performed following the reception, by the controller circuit 60, of a further pulse of the external clock signal clk, such a further pulse following the pulse of the external clock signal clk which has been received when the mode signal SRAW was high and which led to the detection of the faulty SRAM cell. Such a further pulse causes the generation of a corresponding pulse of the internal clock signal clk-int, which follows the second pulse of the pair of pulses of the internal clock signal clk-int.

By comparing the abovementioned first data item and the third data item, the controller circuit 60 may determine if the error in the faulty cell has been solved.

In particular, if the bits of the first and third data item that are written in the faulty cell are equal, it can be inferred that, during the writing of the abovementioned first data item, the faulty cell was affected by a temporary error, namely was affected by a read failure. Conversely, if the bits of the first and third data item that are written in the faulty cell are still different, it can be inferred that the faulty cell is affected by a permanent failure, namely is affected by a SNM failure.

Once that SNM failures and read failure are discriminated, in a per se known manner, a target failure analysis can be performed.

Figure 5:
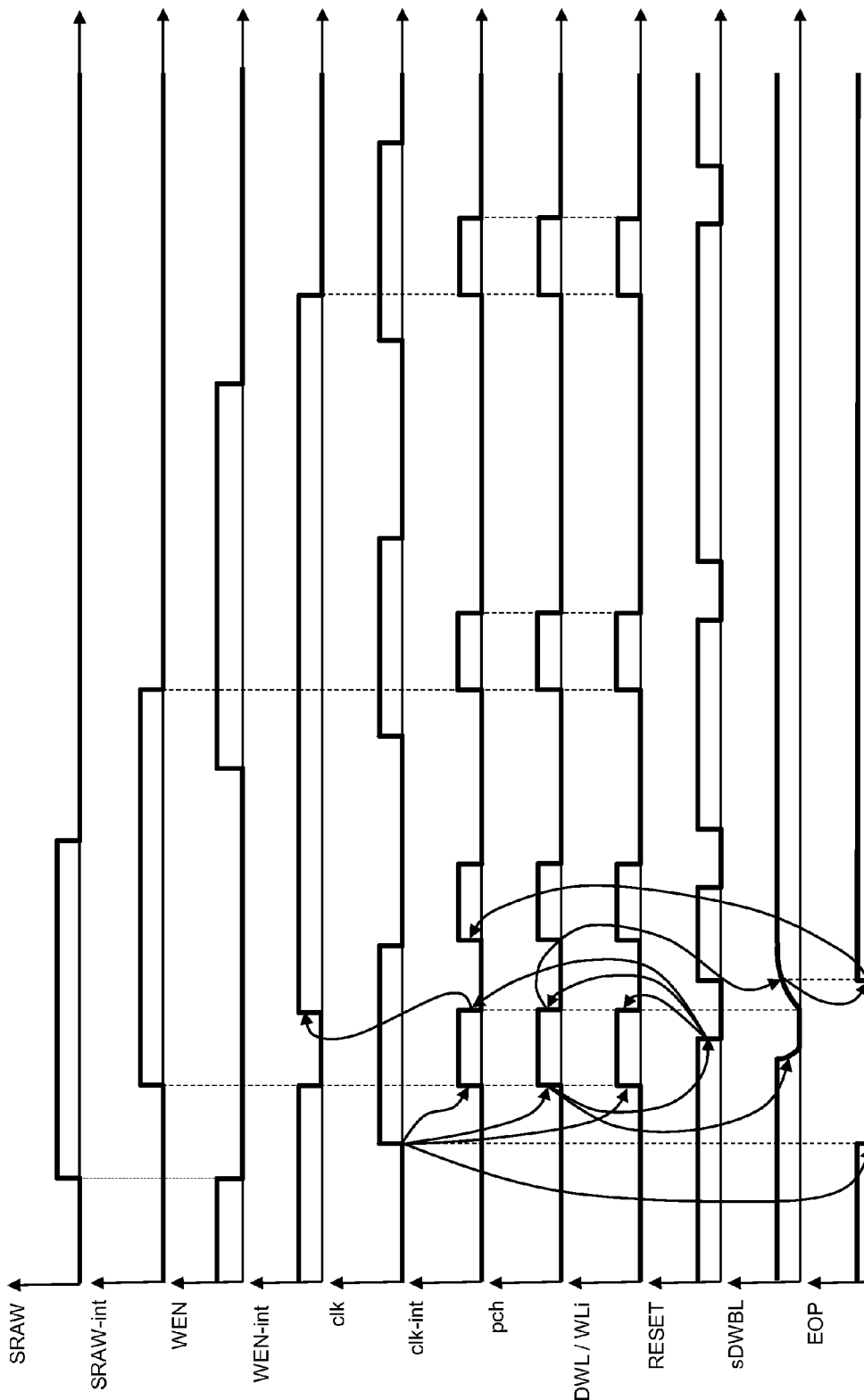
FIG. 5 shows time plots of electric signals generated within the SRAM memory device shown in FIG. 4.

Purely by way of non-limiting example, FIG. 5 refers to the case in which, after this additional reading, the controller circuit 60 carries out a per se known writing. In case no fault is detected when operating in the SRAW mode, after the mode signal SRAW is set low, a per se known access to the SRAM memory device may be carried out, either for reading or writing.

Basically, the present SRAM memory device performs a high speed access by carrying out a "fast" read cycle immediately after a writing operation, at the same SRAM cells involved in such a writing operation and while keeping the SRAM memory device isolated from the external world, instead of restoring the SRAM memory device to the initial state and acquiring a new address and new data for a next access. In such a way, any error occurred during the writing can be quickly detected.

In particular, as described hereinbelow, the present SRAM memory device implements, besides the operation modes commonly implemented by known SRAM memory devices, an additional operation mode, namely the abovementioned SRAW mode.

The advantages of the present SRAM memory device and testing method emerge clearly from the foregoing description. In particular, the present SRAM memory device is characterized by a low cost and easiness of implementation. Furthermore, the present SRAM memory device is technology independent, namely does not depend on the sizes of the memory and can be used in both applications and so-called SRAM Test Vehicles. Put in other words, the present technology identifies SRAM cells affected by write time failures both at test chip level and application level.

Finally, it is clear that numerous variations and modifications may be made to the present SRAM memory device and testing method, all falling within the scope of the invention as defined in the attached claims.

As an example, all the logic signals may be reverted. Furthermore, the pre-charge signal pch may be active when high. In addition, the precise timings between the cited signals may be different than the ones shown in FIG. 5. As an example, the falling edge of the EOP signal may be triggered by the falling edge of the signal sDWBL, instead of the rising edge of the internal clock signal clk-int.

In addition, the reset signal may be generated based on the discharge of the trigger bit line.

Finally, the EOP generator may generate the EOP signal by detecting the voltage difference between the first and second dummy write bit lines DWBLC, DWBLT, thereby implementing a differential operating mode instead of the single-ended operating mode previously described. The same applies to the dummy amplifier and the first and second dummy bit lines DBLC, DBLT.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit, comprising:
    a static random-access memory (SRAM) array having a plurality of memory cells;
    a driving circuit configured to receive an internal clock signal; and
    a controller configured to:
        receive an external clock signal formed by a succession of external pulses;

generate the internal clock signal having a succession of internal pulses;

generate in a first mode, for each external pulse, a corresponding internal pulse;

control in the first mode the driving circuit to carry out one access to the memory array for each internal pulse;

generate in a second mode, for each external pulse, a pair of internal pulses, the pair of internal pulses including a first pulse and a second pulse, the first pulse occurring before the second pulse;

direct in the second mode, upon receiving a first pulse of said pair of internal pulses, the driving circuit to write a first data item in a set of memory cells;

direct in the second mode, upon receiving a second pulse of said pair of internal pulses, the driving circuit to read said set of memory cells to acquire a second data item;

compare the first data item with the second data item; and detect at least one faulty memory cell based on the comparison of the first and second data items.

2. The integrated circuit according to claim 1 wherein the first pulse and second pulse of each pair of internal pulses are distant in time less than a period of the external clock signal, the second mode defining a test mode of the SRAM memory device.

3. The integrated circuit according to claim 2 wherein the controller is further operable in the second mode to:

if the first data item and the second data item are different, control the driving circuit to carry out, upon receiving another internal pulse following the second pulse of said pair of internal pulses, a further read of said set of memory cells to acquire a third data item; and compare the first data item and the third data item.

4. The integrated circuit according to claim 1, comprising:

a pair of data bit lines connected to each corresponding column of memory cells in the memory array; and a dummy write bit line;

wherein said controller is further operable in the first mode to generate a corresponding pre-charge pulse of a pre-charge signal for each generated internal pulse;

wherein said controller is further operable in the second mode to generate a corresponding pair of pre-charge pulses of said pre-charge signal for each generated pair of internal pulses;

wherein each pre-charge pulse includes a first edge and a second edge, the driving circuit configured to receive the pre-charge signal, the driving circuit having:

a data cell discharge circuit configured to discharge the data bit lines following the reception of the first edge of each pre-charge pulse;

a data cell pre-charge circuit configured to recharge the data bit lines following the reception of the second edge of each pre-charge pulse;

a dummy write discharge circuit configured to discharge the dummy write bit line following the reception of the first edge of each first pulse of each pair of pre-charge pulses;

a dummy write pre-charge circuit configured to recharge the dummy write bit line following the reception of the second edge of each first pulse of each pair of pre-charge pulses; and a timing circuit configured to generate an end-of-pre-charge signal indicative of each recharge of the dummy write bit line, the controller further operable in the second mode to:

generate the second pulse of each pair of internal pulses based on said end-of-pre-charge signal.

5. The integrated circuit according to claim 4, comprising:

a load coupled to the dummy write bit line, said end-of-pre-charge signal further indicative of the end of the recharge of the data bit-lines following the reception of the second edge of each first pulse of each pair of pre-charge pulses.

6. The integrated circuit according to claim 4, said driving circuit comprising:

an access circuit;

wherein said controller is further operable in the first mode to:

direct the access circuit to carry out one operation between a reading or a writing of the memory array during the time interval between each discharge and the following recharge of the data bit lines; and wherein said controller is further operable in the second mode to:

direct the access circuit to write said first data item during the time interval between the discharge and the recharge of the data bit lines which follow, respectively, the reception of the first and second edge of the first pulse of the pair of pre-charge pulses which corresponds to said pair of internal pulses; and direct the access circuit to read said second data item during the time interval between the discharge and the recharge of the data bit lines which follow, respectively, the reception of the first and second edge of the second pulse of the pair of pre-charge pulses which corresponds to said pair of internal pulses.

7. The integrated circuit according to claim 4, comprising:

a dummy read bit line;

a dummy read discharge circuit configured to discharge the dummy read bit line following the reception of the first edge of each pre-charge pulse;

a dummy read pre-charge circuit configured to recharge the dummy read bit line following the reception of the second edge of each pre-charge pulse;

a reset circuit configured to generate a reset signal indicative of the end of the discharge of the dummy read bit line;

wherein said controller is configured to receive the reset signal;

wherein said controller is further operable in the first mode to:

generate a first and a second edge of each internal pulse as a function of, respectively, an edge of the corresponding external pulse and said reset signal; and wherein said controller is further operable in the second mode to:

generate the first and the second edge of the first pulse of said pair of internal pulses as a function of, respectively, an edge of the corresponding external pulse and said reset signal; and generate the first and the second edge of the second pulse of said pair of internal pulses as a function of said end-of-pre-charge signal and said reset signal.

8. A method to test a static random-access memory (SRAM) memory device including a memory array formed by a plurality of memory cells, a driving circuit, and a controller, said method comprising:

receiving an external clock signal formed by a succession of external pulses;

generating an internal clock signal formed by a succession of internal pulses;

selecting a first set of acts during a first mode and selecting and selecting a second set of acts during a second mode;
carrying out the acts of the selected set;
wherein the first set of acts includes:
  generating, for each external pulse, a corresponding internal pulse; and
  carrying out one access to the memory array for each internal pulse; and
wherein the second set of acts includes:
  generating, for each external pulse, a pair of internal pulses, the pair of internal pulses including a first pulse and a second pulse, the first pulse occurring before the second pulse and, for each pair of internal pulses:
    at a first pulse of said pair of internal pulses, writing a first data item in a set of memory cells;
    at a second pulse of said pair of internal pulses, reading said set of memory cells to acquire a second data item;
    comparing the first data item with the second data item; and
    detecting at least one faulty memory cell based on the comparison of the first and the second data items.

9. The method according to claim 8, comprising:
in case the first and the second data item are different:
carrying out, upon receiving another internal pulse which follows the second pulse of said pair of internal pulses, a further reading of said set of memory cells to acquire a third data item; and
comparing the first data item and the third data item.

10. The method according to claim 8, comprising:
providing a pair of data bit lines, each pair connected to a corresponding column of memory cells in the memory array;
providing a dummy write bit line;
wherein the first set of acts further includes:
  generating a corresponding pre-charge pulse of a pre-charge signal for each internal pulse;
wherein the second set of acts further includes:
  generating a corresponding pair of pre-charge pulses of said pre-charge signal for each pair of internal pulses, each pre-charge pulse having a first edge and a second edge;
  discharging the data bit lines following the first edge of each pre-charge pulse;
  recharging the data bit lines following the second edge of each pre-charge pulse;
  discharging the dummy write bit line following the first edge of each first pulse of each pair of pre-charge pulses; and
  recharging the dummy write bit line following the second edge of each first pulse of each pair of pre-charge pulses;
wherein the method further includes generating an end-of-pre-charge signal indicative of each recharge of the dummy write bit line;
wherein the second set of acts further includes:
  generating the second pulse of each pair of internal pulses based on said end-of-pre-charge signal.

11. The method according to claim 10, wherein said generated end-of-pre-charge signal is also indicative of the end of the recharge of the data bit-lines following the second edge of each first pulse of each pair of pre-charge pulses.

12. The method according to claim 10 wherein the first set of acts further includes:
carrying out one operation between a reading or a writing of the memory array during the time interval between each discharge and the following recharge of the data bit lines; and
wherein said second set of acts includes:
writing said first data item during the time interval between the discharge and the recharge of the data bit lines which follow, respectively, the first and second edge of the first pulse of the pair of pre-charge pulses which corresponds to said pair of internal pulses; and
reading said second data item during a time interval between the discharge and the recharge of the data bit lines which follow, respectively, the first and second edge of the second pulse of the pair of pre-charge pulses which corresponds to said pair of internal pulses.

13. A single integrated circuit memory device, comprising:
a memory array having a plurality of memory cells; and
a controller configured to:
  generate, in a first mode, a series of internal clock pulses;
  carry out, in the first mode, one access to the memory array for each internal pulse of the series of internal clock pulses;
  generate, in a second mode, a series of internal clock pulse pairs, the pair of internal pulses including a first pulse and a second pulse, the first pulse having a first edge and a second edge that occur before a first edge of the second pulse;
  write a first data item in a set of memory cells, in the second mode, upon receiving the first pulse of each internal clock pulse pair;
  read a second data item from the set of memory cells, in the second mode, upon receiving the second pulse of each internal clock pulse pair;
  compare the first data item with the second data item; and
  detect at least one faulty memory cell of the plurality of memory cells based on the comparison of the first and second data items.

14. The single integrated circuit memory device according to claim 13 wherein the first and second pulse of each pair of internal pulses are distant in time less than a period of an external clock signal, and the second mode defines a test mode of the memory device.

15. The single integrated circuit memory device according to claim 14 wherein the controller is further operable in the second mode to:
read, if the first and the second data items are different, upon receiving another internal pulse following the second pulse of a respective internal clock pulse pair, a third data item from the set of memory cells; and
compare the first data item to the third data item.

* * * * *